(12) United States Patent
Holcombe

(10) Patent No.: US 6,356,375 B1
(45) Date of Patent: *Mar. 12, 2002

(54) APPARATUS AND METHOD FOR AN INTEGRATED PHOTODIODE IN AN INFRARED RECEIVER

(75) Inventor: Wayne T. Holcombe, Palo Alto, CA (US)

(73) Assignee: Integration Associates, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/041,062

(22) Filed: Mar. 10, 1998

Related U.S. Application Data

(63) Continuation of application No. 08/827,402, filed on Mar. 27, 1997, now Pat. No. 5,864,591.

(51) Int. Cl.[7] .................. H04B 10/00; H04B 10/06; H04B 10/10
(52) U.S. Cl. ........................ 359/189; 359/193
(58) Field of Search ................. 359/189, 193, 359/194

(56) References Cited

U.S. PATENT DOCUMENTS

| | | | |
|---|---|---|---|
| 3,619,660 A | 11/1971 | Rugo | 307/264 |
| 4,241,455 A | 12/1980 | Eibner | 455/600 |
| 4,528,519 A | 7/1985 | van Driest | 330/279 |
| 4,757,502 A | 7/1988 | Meuriche et al. | 370/104 |
| 5,081,653 A | 1/1992 | Saito | 375/98 |
| 5,329,115 A | 7/1994 | Lim | 250/214 R |
| 5,361,395 A | 11/1994 | Yamamoto | 455/33.2 |
| 5,557,634 A | 9/1996 | Balasubramanian | 375/222 |
| 5,585,952 A | 12/1996 | Imai et al. | 359/135 |
| 5,706,110 A | 1/1998 | Nykanen | 359/110 |
| 5,760,942 A | 6/1998 | Bryant | 359/193 |
| 5,864,591 A * | 1/1999 | Holcomb | 375/345 |
| 5,884,153 A | 3/1999 | Okada | |
| 5,917,865 A | 6/1999 | Kopmeiners et al. | |
| 6,018,650 A | 1/2000 | Petsko et al. | |
| 6,038,049 A | 3/2000 | Shimizu et al. | 359/189 |

OTHER PUBLICATIONS

Ernesto Perea "Technology Directions; Optical Interconnects, High Temperature, & Packaging" Feb. 10, 1996, ISSCC96, 8 pages.
IBM Microelectronics "Infrared Transceiver Module–IBM31T1101" Nov. 6, 1996, http:///www.chips.ibm.com.
Temic Semiconductors "TFDS 6000 Integrated Infrared Transceiver Module IrDA" 8/96, 12 pages.
Hewlett–Packard "Infrared Transceiver Preliminary Technical Data HSDL–1100" Nov. 17, 1995.
Novalog, Inc. "SIRFIR™ 4Mbps IrDA Transceiver" 4/96 info@novalog.com.
Dr. Keming W. Yeh and Dr. Lichen Wang" An Introduction to the IrDA Standard and System Implementation" Wireless System Design 5/96, 11 pages.
Temic Semiconductors "IrDA Compatible Data Transmission" 4/96, pp. 1–18.

* cited by examiner

*Primary Examiner*—Jason Chan
*Assistant Examiner*—Agustin Bello
(74) *Attorney, Agent, or Firm*—Vernon W. Francissen

(57) ABSTRACT

A method and apparatus are shown for integrating a photodiode and a receiver circuit on a single substrate. An input signal is received with the photodiode. The receiver circuit is configured to suppress feedback from an output terminal of the receiver circuit to the photodiode by amplifying the input signal to produce an amplified input signal, controlling the gain of the input signal amplification responsive to the magnitude of the amplified input signal, comparing the amplified input signal to a detection threshold voltage to produce a digital data signal, and holding the gain at a substantially constant level in response to a fast signal transition in the digital output signal.

24 Claims, 9 Drawing Sheets

IMPROVED INTEGRATED PHOTODIODE
WITHOUT EXTERNAL SHIELDS

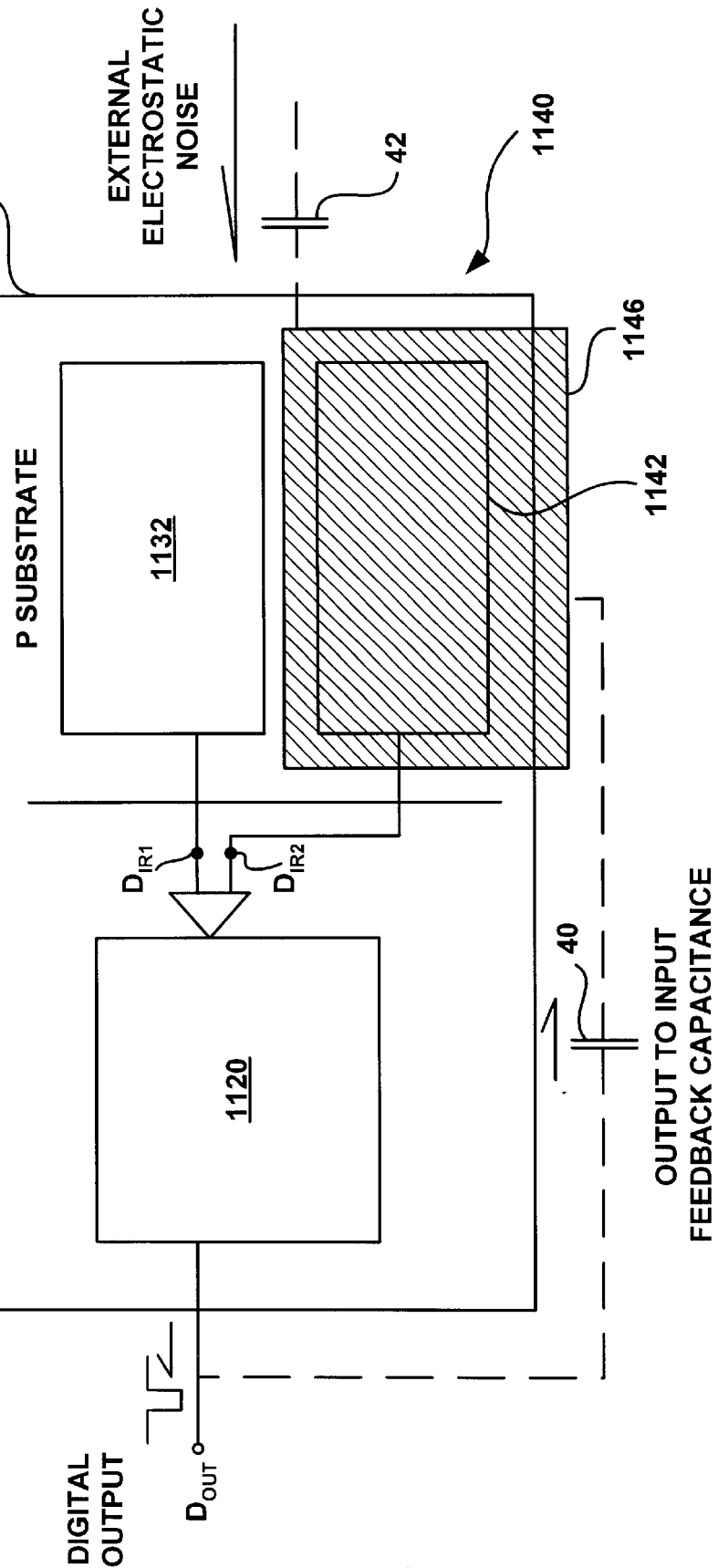

APPARATUS AND METHOD FOR AN INTEGRATED PHOTODIODE IN AN INFRARED RECEIVER

This is a continuation-in-part of application Ser. No. 08/827,402, filed Mar. 27, 1997, now U.S. Pat. No. 5,864, 591.

BACKGROUND OF THE INVENTION

1. Field of Invention

The present invention relates to an integrated photodiode and infrared receiver circuit.

2. Description of the Related Art

Infrared wireless data communication is a useful method for short range (in the approximate range of 0–10 meters) wireless transfer of data between electronic equipment; such as, cellular phones, computers, computer peripherals (printers, modems, keyboards, cursor control devices, etc.), electronic keys, electronic ID devices, and network equipment. Infrared wireless communication devices typically have the advantages of smaller size, lower cost, fewer regulatory requirements, and a well defined transmission coverage area as compared to radio frequency wireless technology (i.e. the zone of transmission is bounded by physical walls). In addition, infrared wireless communication has further advantages with regard to reliability, electromagnetic compatibility, multiplexing capability, easier mechanical design, and convenience to the user as compared to cable based communication technology. As a result, infrared data communication devices are useful for replacing 0–10 meter long data transfer cables between electronic devices, provided that their size and costs can be reduced to that of comparable cable technology. As examples of the type of wireless communications links that are presently in use, the Infrared Data Association (IrDA) Physical Layer Link Specification 1.1e specifies two main physical layer infrared modulation protocols.

The IrDA Physical Layer Link Specification 1.1e also specifies two modes for modulation of data on the infrared transmitted signal. One mode is a low-speed (2.4 Kbp/s to 115 Kbp/s) on-off infrared carrier using asynchronous modulation where the presence of a pulse indicates a 0 bit and the absence of a pulse indicates a 1 bit. The second mode is a high speed (576 Kbp/s to 4 Mb/s) synchronous Four Pulse Position Modulation (4 PPM) method in which the time position of a 125 nS infrared pulse in a 500 nS frame encodes two bits of information. The 1.1e specification also specifies a preamble pattern which is sixteen repeated transmissions of a predetermined set of symbols.

Infrared data communications devices typically consist of transmitter and receiver components. The infrared data transmitter section consists of one or more infrared light emitting diodes (LEDs), an infrared lens, and an LED current driver. A conventional infrared data receiver typically consists of an infrared photodiode and a high gain receiver amplifier with various signal processing functions, such as automatic gain control (AGC), background current cancelling, filtering, and demodulation. For one-directional data transfer, only a transmitter at the originating end and a receiver at the answering end is required. For bi-directional communication, a receiver and transmitter at each end is required. A combined transmitter and receiver is called a transceiver.

A representative example of a conventional infrared data transmitter and receiver pair is shown in FIG. 1A. Infrared transmitter 10 includes LED 16 which generates a modulated infrared pulse in response to transistor 14 being driven by the data signal input at $D_{IR}$. The modulated infrared signal is optically coupled to an infrared detector, such as photodiode 24 normally operated in current mode (versus voltage mode) producing an output current which is a linear analog of the optical infrared signal falling on it. The infrared pulses generated by LED 16 strike photodiode 24 causing it to conduct current responsive to the data signal input at $D_{IR}$ thereby generating a data signal received at $D_{IR}$.

In receiver 20, the signal received at $D_{IR}$ is transformed into a voltage signal $V_{IR}$ and amplified by amplifier 26. The signal output from amplifier 26 then feeds into comparator 42 which demodulates the received signal by comparing it to a detection threshold voltage $V_{DET}$ in order to produce a digital output data signal at $D_{OUT}$.

The received signal waveform will have edges with slope and will often include a superimposed noise signal. As a result, $V_{DET}$ is ideally placed at the center of the received signal waveform so that the output data signal has a consistent waveform width despite the slope of the received signal edges. Also, placing $V_{DET}$ at the center of the received signal improves the noise immunity of receiver 20 because the voltage difference between $V_{DET}$ and both the high and low levels of the received signal is maximized such that noise peaks are less likely to result in spurious transitions in $D_{OUT}$.

The received signal, however, can vary in amplitude by several orders of magnitude due primarily to variations in the distance between transmitter 10 and receiver 20. The strength of the received signal decreases proportional to the square of the distance. Depending on the range and intensity of the infrared transmitter, the photodiode outputs signal current in the range of 5 nA to 5 mA plus DC and AC currents arising from ambient infrared sources of sunlight, incandescent and fluorescent lighting. As a consequence, the center of the received signal waveform will vary, whereas $V_{DET}$ must generally be maintained at a constant level. To address this problem, receivers typically include an automatic gain control (AGC) mechanism to adjust the gain responsive to the received signal amplitude. The received signal is fed to AGC peak detector 36 which amplifies the signal and drives current through diode 32 into capacitor 28 when the signal exceeds the AGC threshold voltage $V_{AGC}$ in order to generate a gain control signal. The gain control signal increases in response to increasing signal strength and correspondingly reduces the gain of amplifier 26 so that the amplitude of the received signal at the output of amplifier 26 remains relatively constant despite variations in received signal strength.

At a minimum, infrared receiver 20 amplifies the photodetector signal current and then level detects or demodulates the signal when it rises above the detect threshold $V_{DET}$ thereby producing a digital output pulse at $D_{OUT}$. For improved performance, the receiver may also perform the added functions of blocking or correcting DC and low frequency AC ambient (1–300 uA) signals and Automatic Gain Control (AGC) which improves both noise immunity and minimizes output pulse width variation with signal strength.

The structure of the conventional discrete PIN photodiode 24 is illustrated in FIG. 1B. A wafer 50 is lightly doped with N dopant in order to produce an intrinsic region 56. A P+ region 52 is formed on one surface of the wafer and an N+ region 58 is formed on the opposing surface of wafer 50 with intrinsic region 56 interposed P+ region 52 and N+ region 58. A reflective layer 60, typically gold, is disposed on the surface containing P+ region 58 with reflective layer 60 also serving as the electrical contact to N+ region 58. A metal contact 54 is disposed on the surface containing P+ region 52 to provide the electrical connection to the P+ region.

Typically, one power supply potential is applied to the reflective layer 60 and another power supply voltage is applied to contact 54 to reverse bias the PN junction formed by P+ region 52 and N+ region 18. This forms a depletion region within the intrinsic region 56 wherein electron and hole charge carrier pairs generated by light photons incident upon the intrinsic region 56 are rapidly accelerated toward the P+ and N+ regions respectively by the electric field of the reverse bias voltage. Charge carrier pairs are also typically generated outside the depletion region within intrinsic region 56 which diffuse, due to random thermal motion of the carriers, at a much slower velocity until they reach either the depletion region or the junction formed by P+ region 52 and intrinsic region 56 of photodiode 24.

A conventional photodiode that is designed for high quantum, i.e. light conversion, efficiency requires that the light path within the photo current collection zone, i.e the depletion and non-depletion zones within intrinsic region 56, be sufficient in length so that most of the light photons of the incident light signal area absorbed and converted into electron-hole pairs that are collectable at the P+ and N+ regions. Usually, this requires that the width of the intrinsic region 56, which is the primary light collection region, be several times the length required for light absorption. If diode 10 has an efficient back-side reflector, such as reflective layer 60, which effectively doubles the light path within diode 24, then the intrinsic region 56 of the photodiode can be made narrower. For a typical near infrared silicon photodiode, the nominal absorption path length is about 15–25 microns. The path length should be at least two to three times the nominal absorption path length to obtain good light conversion efficiency.

The inclusion of lightly doped intrinsic region 56 between the P+ and N+ regions 52 and 58 results in a PIN photodiode with a wider depletion region, depending on the magnitude of the reverse bias voltage, which improves the light collection efficiency, increases speed, and reduces capacitance over that of a simple PN diode structure.

The PIN photodiode is typically produced by diffusing the N+ region 58 on the back side of the lightly doped (N) wafer 50, diffusing the P+ region 52 on the topside of the wafer 50, and then adding metal contacts to each side of the wafer. Typically, the backside contact area connected to N+ region 58 is reflective layer 60 and is made of gold. The reflective layer is then typically connected to the ground voltage terminal.

Although a PIN photodiode outperforms a standard PN diode, the PIN photodiode structure cannot be easily manufactured by standard semiconductor processes wherein fabrication is typically performed on only one side of the semiconductor wafer 50.

In typical high volume applications, it is now standard practice to fabricate the receiver circuitry and transmitter driver in a single integrated circuit (IC) to produce a transceiver IC. As described above, it is difficult to integrate an efficient PIN photodiode on the same semiconductor substrate as the transceiver circuit. As a result, a discrete infrared photodiode is typically assembled with the transceiver circuit and an LED, along with lenses for the photodiode and LED, into a plastic molded package to form a transceiver module. The transceiver module is designed to be small in size and allow placement in the incorporating electronic device so as to have a wide angle of view, typically through an infrared window on the transceiver casing. The transceiver IC is designed to digitally interface to some type of serial data communications device such as an Infrared Communication Controller (ICC), UART, USART, or a microprocessor performing the same function.

Accordingly, it is advantageous to integrate a photodiode and receiver or transceiver circuit on a single substrate to reduce the overall size of the resulting infrared device and to reduce the costs involved with assembling a discrete photodiode with a receiver or transceiver chip to produce a receiver or transceiver module.

SUMMARY OF THE INVENTION

The present invention relates to an apparatus and method for integrating a photodiode and a receiver circuit on a single substrate.

An embodiment of an integrated photodiode and receiver circuit on a substrate, according to the present invention, includes a first diffused region in the substrate for receiving an input signal, a first circuit input terminal coupled to the first diffused region, and a circuit output terminal. An input amplifier is interposed between the first circuit input and receiver output terminals, where the input amplifier receives and amplifies the input signal to produce an amplified input signal, and wherein the input amplifier varies the gain of the input amplifier responsive to a gain control signal. A bandpass filter is interposed between the input amplifier and the circuit output terminal, where the bandpass filter receives and bandpass filters the amplified input signal so as to produce a filtered input signal. A comparator is interposed between the bandpass filter and the circuit output terminal and compares the filtered input signal to a detection threshold voltage level in order to generate a digital output signal. A delay circuit is interposed between the comparator and the circuit output terminal which receives the digital output signal and generates a delayed digital output signal responsive thereto. An automatic gain control circuit receives the filtered input signal and compares the filtered input signal to an automatic gain control threshold voltage and generates the gain control signal responsive thereto. An isolation control signal generator receives the delayed digital output signal and generates an isolation control signal responsive thereto. An isolation switch is interposed between the input amplifier and the automatic gain control circuit, which receives the isolation control signal and, responsive thereto, isolates the automatic gain control circuit from the amplified input signal.

Another embodiment of an infrared receiver circuit formed on a substrate, according to the present invention, includes a first diffusion in the substrate and an input amplifier having first and second input terminals, a gain control terminal and an output terminal, where the first input terminal receives a first bias voltage and the second input terminal is coupled to the first diffusion. A bandpass filter has input and output terminals, where the input terminal is coupled to the output terminal of the input amplifier. A comparator has first and second input terminals and an output terminal, where the first input terminal receives a detection threshold voltage, the second input terminal is coupled to the output of the bandpass filter, and the output terminal is coupled to an output terminal of the receiver circuit. An automatic gain control circuit has first and second input terminals and an output terminal, where the first input terminal is coupled to the output of the bandpass filter, the second input terminal receives an automatic gain control threshold voltage, and the output terminal is coupled to the gain control terminal of the input amplifier. A delay circuit has input and output terminals, wherein the input terminal is coupled to the output terminal of the comparator such that an output data signal is generated at the output terminal of the delay circuit responsive to the input data signal. An isolation control signal generator has input and output terminals, wherein the input terminal is coupled to the output terminal of the delay circuit, and wherein the isolation control signal generator generates a pulse of predetermined duration at its output terminal responsive to an edge in the output data signal. An isolation switch has input, output and control terminals, where the control terminal is coupled to the output terminal of the isolation control signal generator such that the isolation switch isolates the input terminal thereof from the output terminal thereof responsive to the automatic gain control signal, the input terminal of the isolation switch is coupled to the output terminal of the input amplifier, the output terminal of the isolation switch is coupled to the first input terminal of the automatic gain control circuit such that the isolation switch is interposed between the first input terminal of the automatic gain control circuit and the output terminal of the input amplifier whereby the isolation switch isolates the automatic gain control circuit from the output terminal of the input amplifier responsive to the isolation control signal.

An embodiment of a method for suppressing feedback in a photodiode and a receiver fabricated on a substrate, according to the present invention, involves receiving an input signal with the photodiode, amplifying the input signal to produce an amplified input signal, controlling the gain of the input signal amplification responsive to the magnitude of the amplified input signal, comparing the amplified input signal to a detection threshold voltage to produce a digital data signal, and holding the gain at a substantially constant level in response to a fast signal transition in the digital output signal.

The features and advantages of the present invention will become more readily apparent from the following detailed description of a preferred embodiment of the invention which proceeds with reference to the accompanying drawings.

BRIEF DESCRIPTION OF THE DRAWINGS

In the following drawings, elements which are identical or analogous between drawings are identified with reference numbers which are also identical or analogous.

FIG. 8 is a diagram of an embodiment of an integrated receiver and photodiode of the present invention utilizing two photodiodes and a differential input receiver.

DETAILED DESCRIPTION OF THE PRESENT INVENTION

Figure 1A:
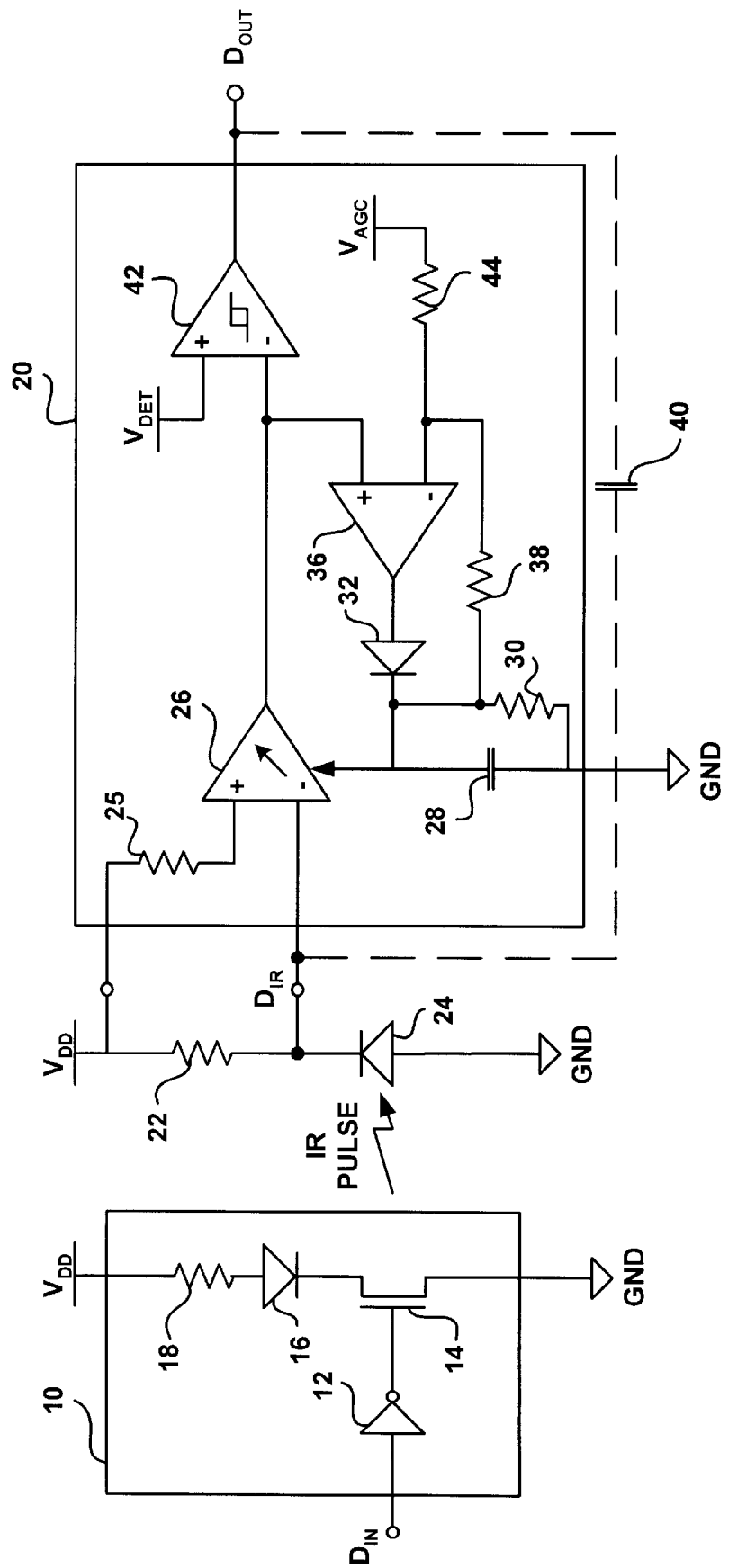
FIG. 1A is a circuit diagram of a conventional infrared transmitter receiver pair.
Figure 1B:
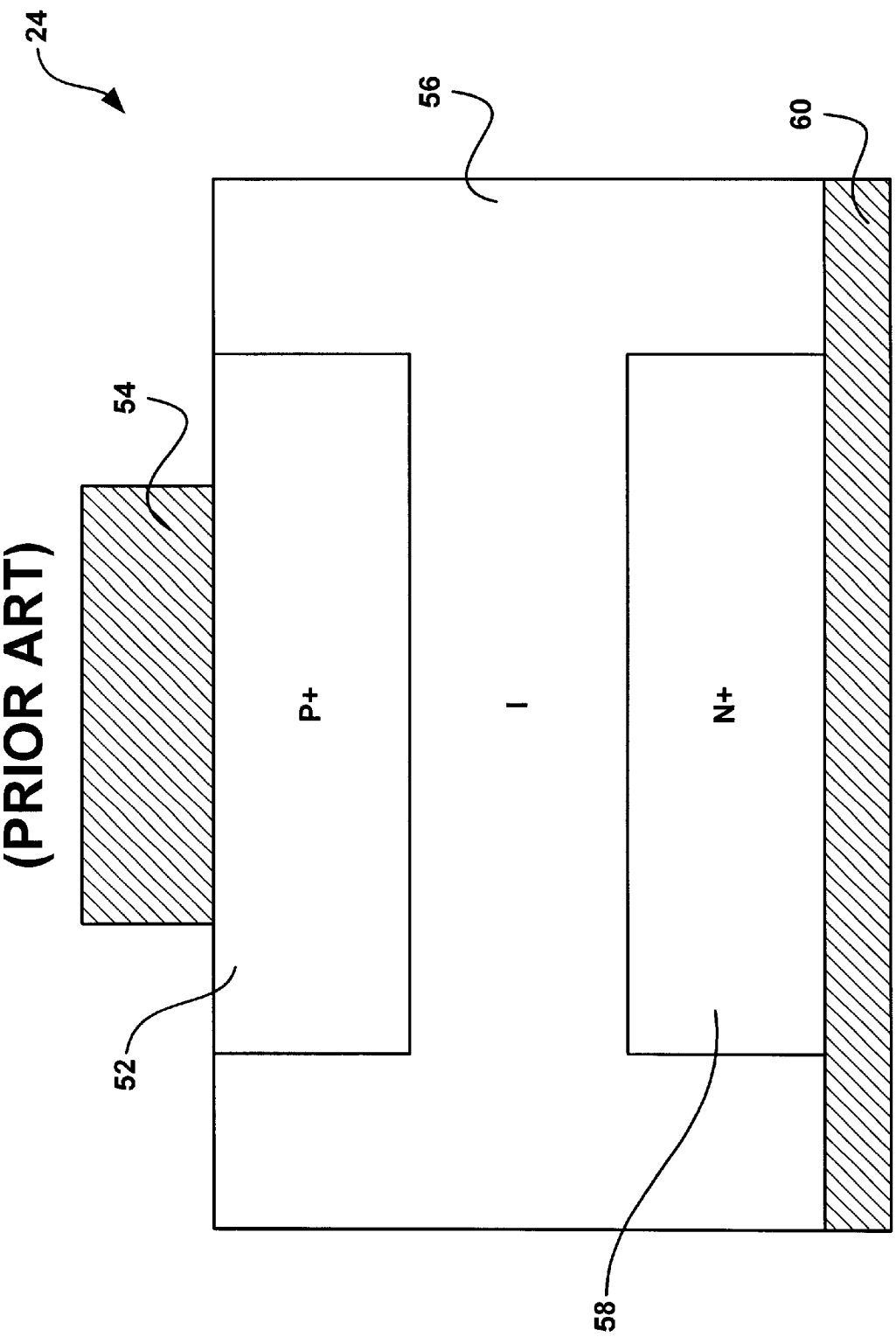
FIG. 1B is a cross-sectional diagram of a conventional PIN photodiode.

Because of the cost associated with assembling the transceiver module into a single package, it is desirable to integrate the photodiode and the receiver circuit on a single silicon substrate. However, constructing an IrDA receiver or transceiver with an integrated photodiode has typically not been either cost effective or sufficiently optically sensitive to have the range to meet the IrDA lowspeed specification.

In general, IrDA receivers typically use discrete photodiodes with areas of 3.4 to 25 square millimeters in order to produce the minimum signal level, typically 30 nA to 220 nA, required by the minimum detect threshold of an IrDA receiver at a range of 1 meter. A receiver or transceiver IC typically has an area of 2 to 10 square millimeters depending upon the IC fabrication process technology employed and the complexity of the circuit design.

Although photodiodes can be constructed using a standard IC fabrication process, the resulting photodiodes typically suffer from reduced efficiency, signal bandwidth, or very high capacitance as compared to photodiodes fabricated using a process optimized for photodiodes. Because there are significantly fewer processing steps and fewer photolithographic masks of low optical resolution required for a photodiode optimized process, a photodiode specific silicon process typically costs about one half or less per unit area than a modern silicon IC process. In addition, because process yields are higher and testing is simpler for a photodiode specific process, there is a further reduction in cost per area of perhaps another 20% to 40%. However, the processing and yield cost advantages of the photodiode specific process are partially offset by the assembly cost incurred in the handling, inventory, die attachment, and bonding of the discrete photodiode into a receiver or transceiver module. Also, using conventional design and fabrication techniques, the photodiodes in an IrDA receiver or transceiver are significantly larger than the receiver or transceiver IC and the photodiodes can be fabricated as discrete devices at lower cost per unit area. Thus, it is more cost effective not to integrate the photodiodes with the receiver or transceiver, despite the savings obtained by eliminating the photodiode assembly cost.

Furthermore, photodiodes constructed using a standard IC process will have a light conversion efficiency per unit area which is typically 20% to 80% of the efficiency of a photodiode fabricated using a photodiode specific process. Utilizing the assumption that the photodiode processing costs are typically one half that of the IC process, the integrated diode must be less than half the area of an external photodiode in order for an integrated photodiode and receiver or transceiver IC to be more cost effective than a discrete photodiode solution. The integrated diode will therefore have a signal output that is 10% to 40% the signal output of a cost-equivalent discrete photodiode.

There are still other problems with photodiodes fabricated using standard IC processes. One major problem is that a photodiode fabricated on a standard IC process typically has a capacitance per unit area that is over 100 times higher than the capacitance per unit area of a photodiode fabricated using a process optimized for photodiodes. This increased capacitance causes a significant reduction in the infrared receiver noise/bandwidth performance which in turn requires the use of a larger integrated photodiode than would otherwise be required.

The smallest photodiode signal current which can be detected, given a particular receiver bandwidth, must be greater than the equivalent input noise level of the receiver. Hence, if the receiver's noise level can be reduced then a smaller received signal can be detected. The lower bound on an IC receiver's equivalent input noise level is limited by the input transistor noise performance and area, supply voltage, input device bias currents, and the source impedance which is determined by signal frequency and photodiode capacitance. The principles of low noise photodiode amplifier design, which govern the input noise parameters, are well known to those skilled in the art and will not be expanded upon here. However, given a particular bandwidth, it should be understood that as the capacitance of the photodiode increases and its impedance decreases, then the equivalent input noise current will increase as a square root function, assuming that the infrared receiver amplifier is optimized for minimum noise under these conditions.

For example, a four times increase in the input capacitance of the photodiode will typically result in a two times increase in the equivalent input noise current of a receiver including the photodiode when the receiver is optimized for minimum noise within the same bandwidth. Notice, however, that increasing the area of a photodiode by four times increases the output current gain by four times although it only increases the input noise by two times. Consequently, increasing a photodiode area increases its effective gain, or signal-to-noise ratio, for a given signal illumination level. However, it is also clear that, for a photodiode which has a capacitance that is 100 times greater per unit area, the receiver input noise current of an optimized receiver is increased by 10 fold and therefore requires the minimum detect threshold of the receiver to be increased by 10 fold. Thus, although a photodiode constructed from a standard IC process may have only a moderately degraded efficiency as compared to a photodiode constructed using a photodiode optimized process, the 100 fold larger capacitance of the standard IC process photodiode degrades the receiver noise performance so as to effectively reduce input sensitivity by 10 fold.

Another problem is that an efficient photodiode typically uses the substrate as one of the diode contacts because the light absorption depth of the silicon typically exceeds by several times the shallow junctions on standard IC processes. Since the substrate contact is typically P material, this means that the substrate is an anode connection, which is the reverse of standard external photodiode structure which usually have cathode connections to the substrate. Consequently, an integrated photodiode receiver typically needs to be able to function with the anode to substrate, which is usually coupled to a ground potential supply rail.

In view of these constraints, it is nonetheless possible to build an IrDA receiver with sufficient sensitivity and bandwidth to operate using a small photodiode integrated on the same IC. As an example, such a receiver might use a cost effective integrated photodiode of about 2 mm$^2$ in area. Assuming that the integrated photodiode has about 60% of the efficiency of a standard discrete photodiode, the integrated photodiode would output about a 18 nA pulse when suitably lensed and illuminated with 4 uW/cm$^2$ of infrared light, which is the minimum infrared irradiation level specified for IrDA slow speed operation with a 10$^{-8}$ bit error rate. The receiver utilizing the integrated photodiode requires an equivalent input noise level over the pulse bandwidth of about 2 nA and a signal detection threshold of about 9 nA.

A major problem for the design of IrDA infrared receivers is output feedback noise. The integrated photodiode is vulnerable to feedback capacitance from the receiver output $D_{OUT}$ to the photodiode. For example, an integrated photodiode of 2 mm$^2$ will have a feedback coupling capacitance in the range of 2 to 10 femto Farads (fF) between the upper surface of the photodiode and the surface of the receiver output bonding wire, which will typically be less than 2 mm distance away. Although the integrated photodiode is smaller than a discrete external photodiode, the integrated photodiode is necessarily located closer to the receiver output because it is on the same IC as the receiver circuit. Consequently, the feedback coupling capacitance is of the same order of magnitude as an external photodiode. In addition, because the receiver must be more sensitive to compensate for the smaller and less efficient integrated photodiode, the effects of feedback are proportionately larger.

Specifically, taking the above examples, if the feedback capacitance is as little as 2 femto Farad and the receiver output has a 5V swing, then 10 femto Coulombs (fC) of charge will be transferred to the receiver input terminal for each transition at the receiver output terminal. If the receiver bandwidth is 600 kHz, which is a typical value for a 115 Kbps lowspeed IrDA receiver, then the time constant of the signal transient is (1/600 kHz)/6.28 or about 265 nsec. Consequently, the 10 fC of charge will have an apparent current amplitude of (10 fC/265 nsec) or 376 nA. Notice that this is over 40 times the minimum detect threshold of 9 nA in the above example and will cause disruption of the input signal over 80% of the operating range of the receiver.

Some of the conventional remedies for output to input feedback problems of IrDA receivers are: 1) to use a large photodiode so that the output feedback is proportionately small compared with the signal; 2) install shielding between the output and the input photodiode; and 3) balanced differential output lines and/or balanced input photodiodes. All of these solutions entail increased cost either due to increases in total photodiode area, increased package complexity, or the cost of adding a shield.

In addition, for an IrDA receiver or transceiver IC incorporating an integrated photodiode, adding a shield between the photodiode and the receiver output is especially difficult. Since the IC is very small, typically about 3 to 4 mm long, the shield needs to be placed accurately within 1 mm after die attach and wire bonding. This extra assembly process adds cost to the final package. Another difficulty is that the shield must be designed not to block the infrared light falling on the integrated photodiode.

Another receiver output to photodiode input feedback mechanism not present with an external photodiode but which may be present with an infrared receiver integrated with an on-chip photodiode is feedback coupling through the substrate. This may be due to either carriers injected by the receiver circuitry or by distributed RC coupling through the substrate. For this feedback coupling mechanism, external shielding will not work, although some benefit can be had by placing diffused P and N collector rings connected to suitable supply voltages. These act either as limited substrate shields or as collectors for substrate carriers.

Finally, another problem for infrared data receiver performance, whether built with an external or an integrated photodiode, is external noise pickup, most notably from adjacent digital signal lines. Although the magnitude of the external noise signal is typically less than the magnitude of the feedback signal from the receiver's own output terminal, the external noise can cause receiver disruption from digital lines or other close-by circuit nodes with significant AC signal levels. External shields are often used to control noise from external signals, which again increases the cost of the package and/or increases its total size.

Figure 2:
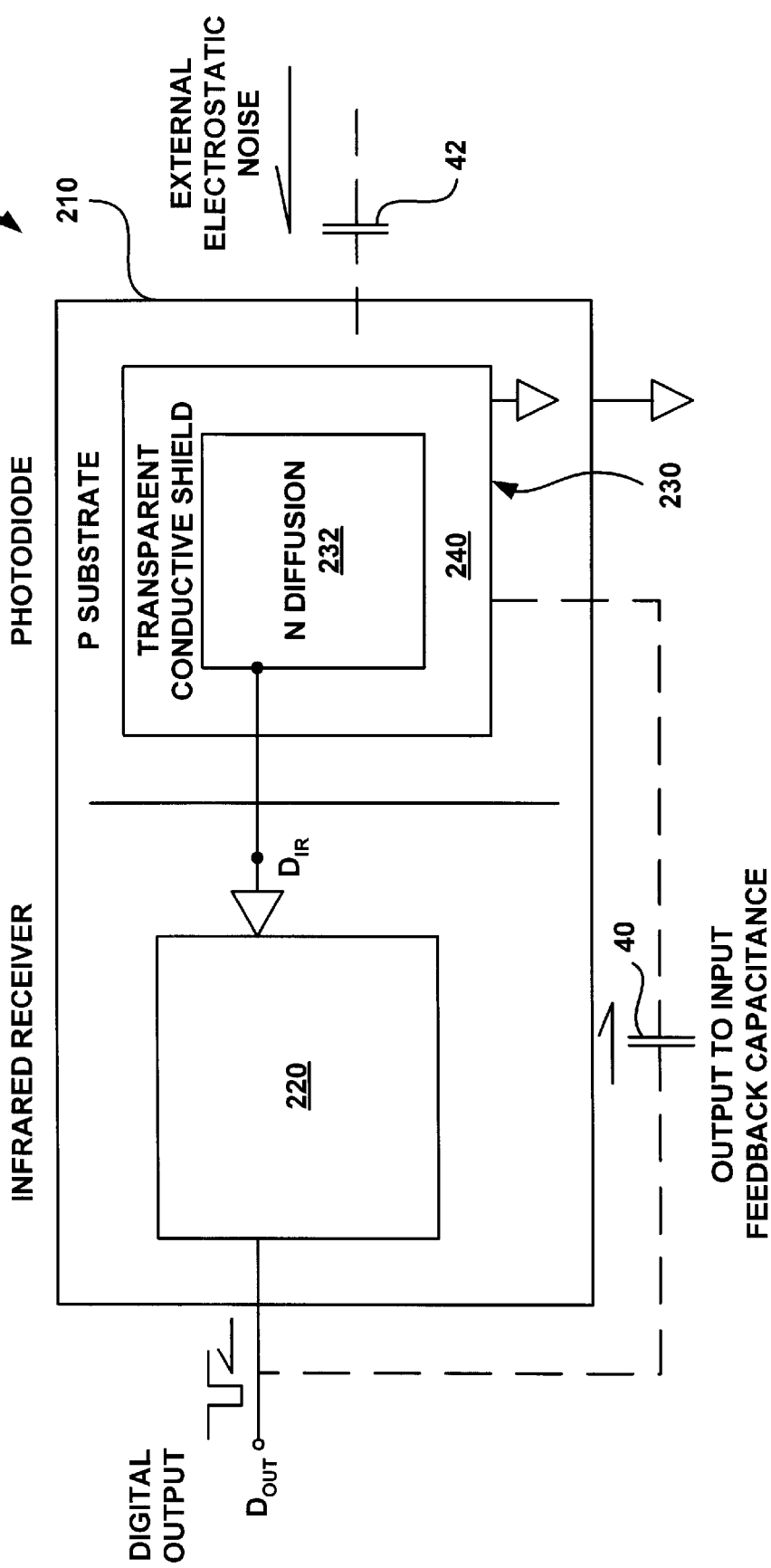
FIG. 2 is a diagram of an embodiment of an integrated receiver and photodiode according to the present invention.

FIG. 2 illustrates a first embodiment of a receiver module 200, according to the present invention, composed of a receiver circuit 220 fabricated on the same IC substrate 210 as a photodiode 230. The photodiode 230 is constructed by forming an N-diffusion 232 formed in P-substrate 210. The N-diffusion 232 is connected to the input terminal $D_{IR}$ of the receiver 220 and the P-substrate 210 is grounded. Optionally, a transparent conductive shield 240 is formed over N-diffusion 232 and the shield is also grounded. The transparent conductive shield can be formed of any transparent conductive material, such as a polysilicon conductive layer. However, a drawback of including the transparent conductive shield 240 is that it doubles the capacitance to ground of photodiode 230. The output $D_{OUT}$ of receiver 220 has a feedback capacitance 40 to photodiode 230.

Figure 3:
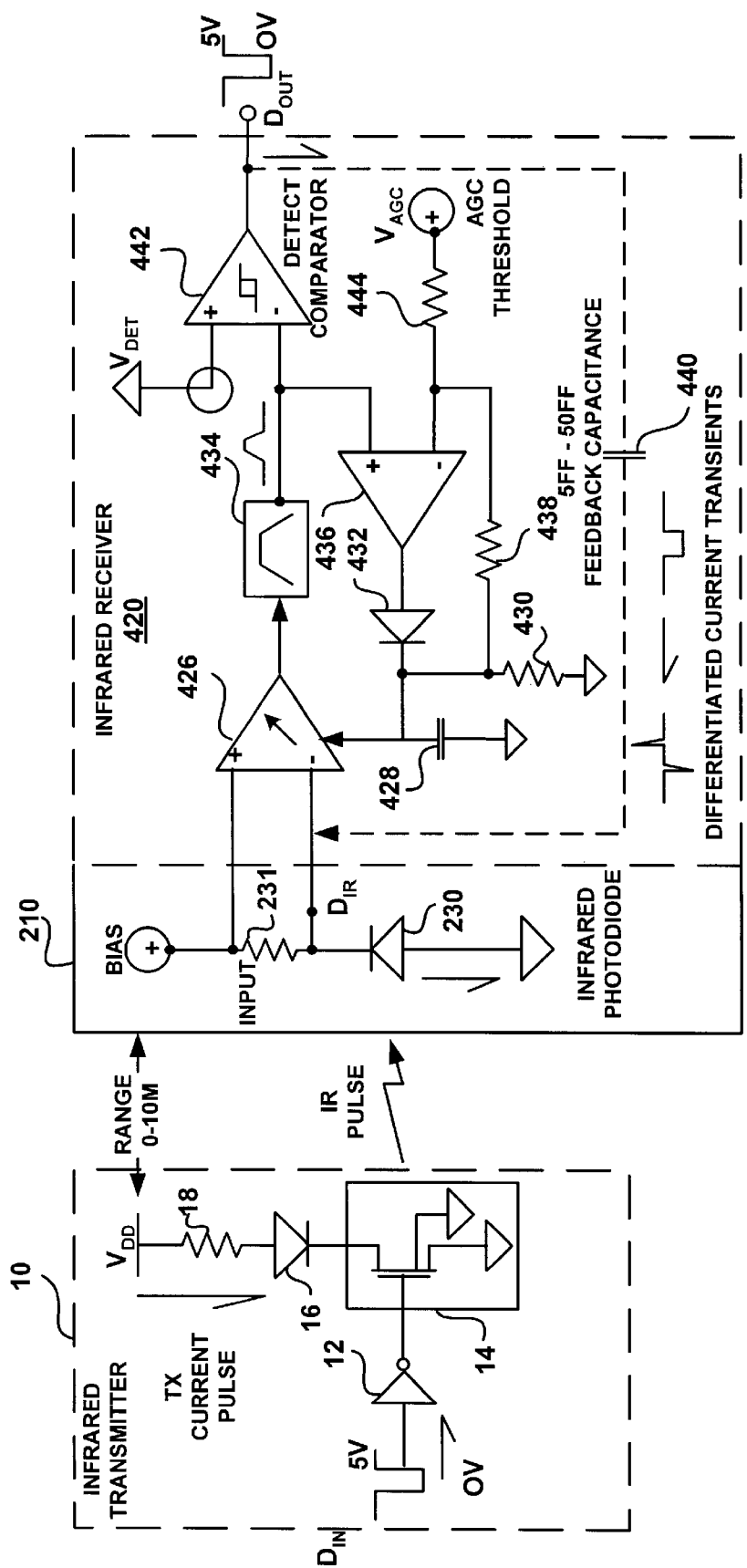
FIG. 3 is a functional block diagram of one embodiment of the infrared receiver circuit of FIG. 2.

FIG. 3 illustrates an embodiment of a receiver circuit 420 designed to mitigate the effects of feedback through control of the feedback phase with the design of the receiver bandwidth filter design such that receiver circuit 420 is suitable for use as the receiver circuit of FIG. 2. For infrared receivers which demodulate using on-off modulation (such as the modulation specified by IrDA), it is possible to receive signals significantly below the feedback transient amplitude provided that the feedback is in phase with the received signal. This is accomplished by designing the receiver so that the feedback from the data output is positive such that the feedback actually reinforces the received signal because the polarity of the feedback spike corresponds to the polarity of the received signal. If the receiver transient response has little overshoot, and either no AGC or high signal threshold AGC is used, then the positive feedback acts as dynamic hysteresis, producing an output pulse without any spurious transitions.

The infrared receiver 420 of FIG. 3 is designed so that the feedback through parasitic capacitor 440 from $D_{OUT}$ to the photodiode input $D_{IR}$ is positive. Thus, a negative transition in the received signal at $D_{IR}$ results in a negative transition in the data output signal at $D_{OUT}$ which will, in turn, generate a corresponding negative spike in the feedback signal.

The received signal is countered by the much larger amplitude of the feedback spike which causes the signal at the input of detect comparator 442 to cross the detect threshold $V_{DET}$ repeatedly. This results in multiple transitions in data output signal thereby corrupting the data.

When the receiver is designed for positive feedback, as is receiver 420, the positive feedback reinforces the received signal. The positive feedback, when combined with the received signal at $D_{IR}$, results in a signal at the input of comparator 442 that swings farther away from $V_{DET}$ responsive to the edges in $D_{IR}$ generating a single output pulse at $D_{OUT}$.

Bandpass filter 434 must be designed for good damped transient response to suppress signal ringing and overshoot. An example of a suitable filter is a Gaussian bandpass filter, which has rolled-off edges in the signal output from the filter that have low ringing and overshoot transient response. In addition, the filter will temporally spread out the energy contained in the feedback spike. For example, a 20 nsec. spike is transformed into a 300 nsec. spike, which further contributes to the dynamic hysteresis discussed above.

However, in order to prevent AGC desensitization, the AGC threshold VAGC of receiver 420 needs to be set above the peak feedback value by a margin adequate to prevent the peak feedback value from causing the gain to be adjusted downward by the AGC. There are undesirable consequences of a high AGC threshold compared with a low AGC threshold. First, AGC noise quieting (which reduces signal interference from noise) is less effective. Secondly, the output pulse width will vary more with signal level.

AGC reduces the front end gain of amplifier 426 responsive to an increasing input signal on $D_{IR}$. Generally, in the absence of an input signal, amplifier 426 will be highly sensitive because the AGC permits the gain to be high. In the presence of noise, however, the AGC will reduce the gain in response to the input signal including the noise level. This improves the noise immunity of the receiver 420. The receiver will function so long as the received signal strength is greater than the amplitude of the noise. From a practical standpoint, in a noisy environment, this permits the sending and receiving devices to be moved closer together to strengthen the received signal and the communications link will be able to function. In the absence of AGC, the noise level will prevent the receiver from capturing the transmitted signal without corruption of the output data signal even when the transmitting device and receiver are close together because the noise signal will still have high enough amplitude to cause spurious output transitions in between valid output transitions.

Also, AGC improves the fidelity of the pulses in the data output $D_{OUT}$. Despite careful filter design, some ringing, overshoot and undershoot will still occur in the receiver. AGC reduces the effect of ringing, overshoot and undershoot when it reduces the sensitivity of amplifier 426. Further, because there is also ramping on the received waveform which can cause widening or narrowing of the signal pulse unless the detect threshold $V_{DET}$ is in the center of the waveform, AGC improves the fidelity of the pulse by maintaining $V_{DET}$ at the center of the waveform.

The amplitude of the positive feedback, however, also causes the AGC to adjust the receiver sensitivity downward. As the AGC reduces the gain in response to the positive feedback, the sensitivity of the receiver to the transmitted signal is also reduced and, particularly at high signal pulse rates, can cause the receiver to lose the input signal.

Whereas the receiver circuit 420 of FIG. 3 is effective in reducing the effects of feedback, it still suffers from the effect of feedback transient overshoot or ringing, which, if it exceeds the detect level $V_{DET}$, will cause undesirable extraneous output pulse transitions. Although the use of well known filter design techniques can limit transient overshoot to a negligible level, in practice, reducing it to a value below ⅕ or ⅒ the peak level is difficult due to variable phase shift effects both within and outside the infrared receiver. Some of these variable phase shift effects are due to normal variances in parameters such as transmit pulse shape, photodiode time constant, photodiode capacitance, receiver output load capacitance, receiver supply voltage, and filter component values.

Receiver 420 can beneficially decrease the disruptive effects of feedback by 10 db–20 db for infrared receivers used with edge triggered, serial data communication controllers which do not need an accurate data pulse width or with receiver systems which do not require the benefits of a low threshold AGC.

Figure 4:
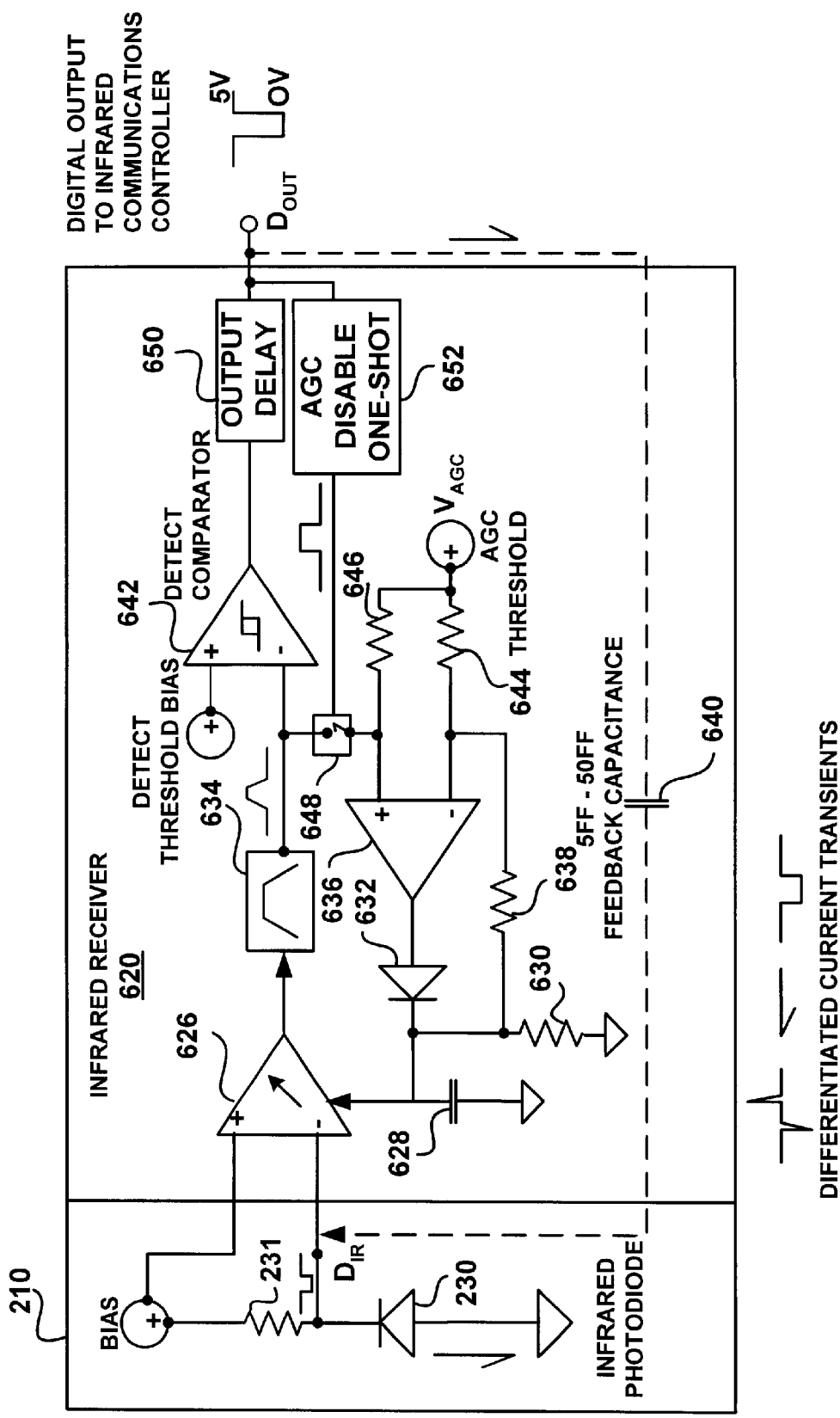
FIG. 4 is a functional block diagram of another embodiment of the infrared receiver circuit of FIG. 2.

Another embodiment of a receiver suitable for use in the present invention is shown in FIG. 4. Infrared receiver 620, which is suitable for the use of low threshold AGC, adds delay 650 to the output signal from comparator 642, typically delaying the output by ½ of the pulse interval of the data signal to permit decay of the feedback pulse. Receiver 620 also includes a signal disable switch 648 controlled by AGC disable one-shot 652 which blocks the signal to the AGC input upon the leading edge of an output pulse transition on $D_{OUT}$.

By delaying the output signal, the peaks of the feedback signal from $D_{OUT}$ to $D_{IR}$ are shifted in time so that the feedback peak occurs toward the center of the pulse in the received signal at $D_{IR}$. Also, AGC disable one-shot 652 generates a signal disable pulse responsive to the falling edge in the output signal at $D_{OUT}$ which causes AGC disable switch 648 to open and isolate the input of AGC peak detector 636 from the received signal path for the duration of the signal disable pulse. The signal disable pulse must persist for a time interval sufficient for the feedback transient to settle below levels which would cause AGC gain reduction. AGC peak detector 636 is therefore isolated from the signal path at the time that the feedback pulse appears at the negative input to comparator 642. As a result, the gain control voltage stored in capacitor 628 during the disable period reflects the received signal strength and is not corrupted by the feedback signal.

Alternatively, the AGC disable one-shot 652 may be replaced with an output edge triggered disable one shot which will generate a disable pulse responsive to both the falling and rising edges of the output signal at $D_{OUT}$. An edge triggered disable will isolate the AGC peak detector 636 during feedback pulses for both the edges of the output pulse at $D_{OUT}$. This approach has the advantage that larger levels of feedback can be tolerated or the use of a low AGC threshold voltage level is permissible because the gain control voltage is not adversely affected by the feedback pulse from the rising edge of the output signal at $D_{OUT}$.

Whereas the performance of receiver 620 is substantially better than the performance of conventional receivers, it requires that receiver 620 be designed so that the feedback from $D_{OUT}$ to $D_{IR}$ is positive. Negative feedback will still cause spurious transitions in the output signal because the feedback is coupled to the input of comparator 642.

Figure 5:
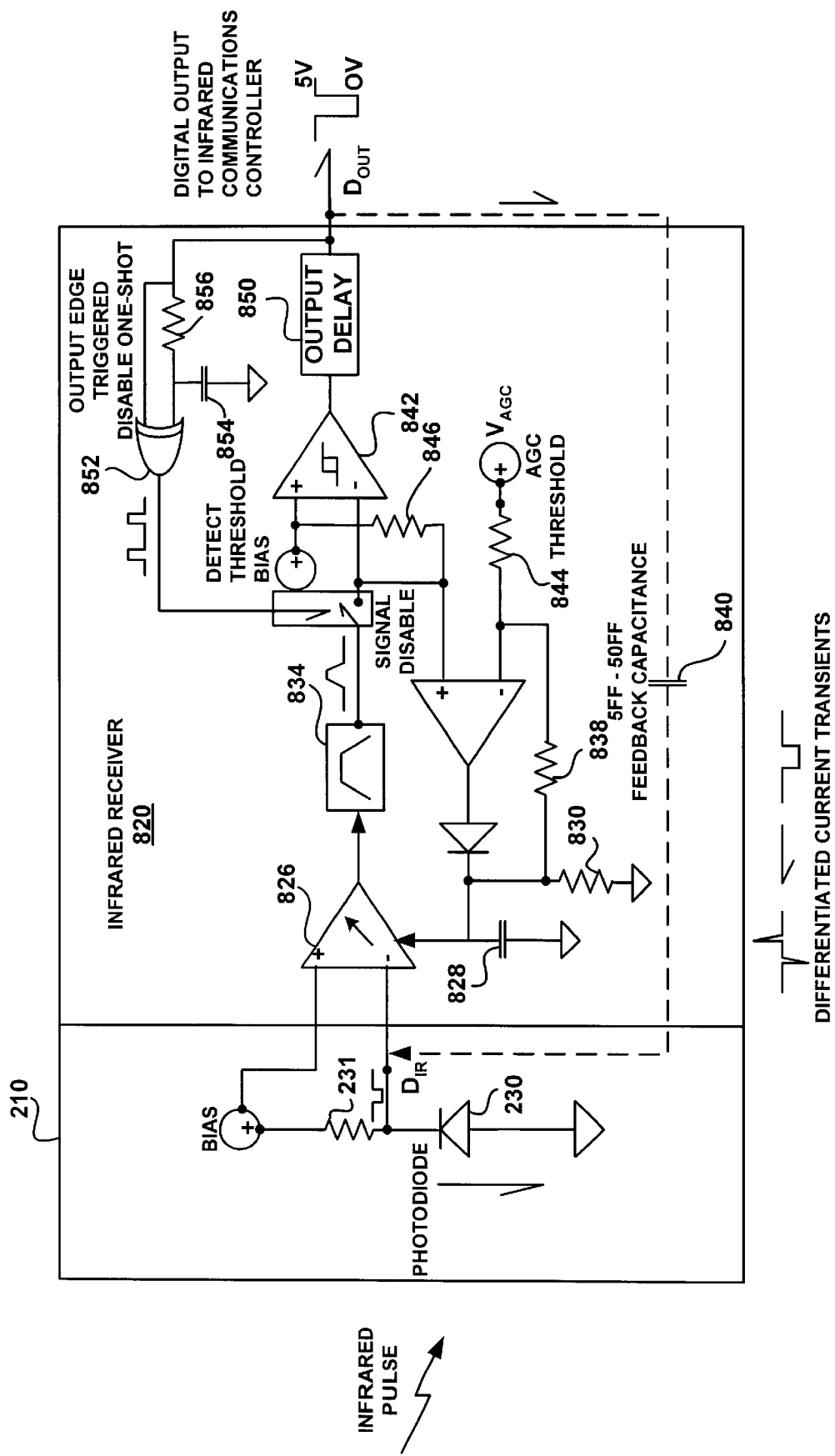
FIG. 5 is a functional block diagram of yet another embodiment of the infrared receiver circuit of FIG. 2.

Receiver 820 of FIG. 5 shows yet another embodiment of a single input receiver circuit suitable for use as the receiver 220 in the present invention but where the design of receiver 820 is not dependent upon positive feedback from output terminal $D_{OUT}$ to input terminal $D_{IR}$. Signal disable switch 848 is positioned between the output of bandpass filter 834 and the inputs of both comparator 842 and AGC peak detector 836. Output edge triggered disable one-shot 852 receives the delayed output signal at $D_{OUT}$ and generates a disable pulse responsive to each of the falling and rising edges of the output signal. The disable signal must persist for a period long enough for the feedback transients to decay below a level that would cause spurious transitions in the output signal from comparator 842. The disable pulses cause signal disable switch 848 to isolate comparator 842 and AGC peak detector 836 from the received signal path during the times when the falling and rising feedback peaks are present at the output of bandpass filter 834. This configuration permits receiver 820 to obtain the improved AGC performance of receiver 620. However, receiver 820 is not dependent upon positive feedback because the input of comparator 842 is isolated from the feedback peaks, thereby preventing the negative feedback peaks from causing spurious transitions in the output signal at $D_{OUT}$.

FIG. 5 also shows greater detail of an example of an output edge triggered disable one-shot. One input terminal of exclusive-OR gate 852 receives the output signal directly while the other input terminal is coupled to the output signal through resistor 756 and to ground through capacitor 854. Resistor 856 and capacitor 854 further delay the output signal such that, when a pulse edge occurs in the output signal, the two inputs of XOR 852 will be at different values for a time period determined by the RC constant of resistor 856 and capacitor 854, which therefore also determine the width of the disable pulses generated by XOR 852.

Figure 6:
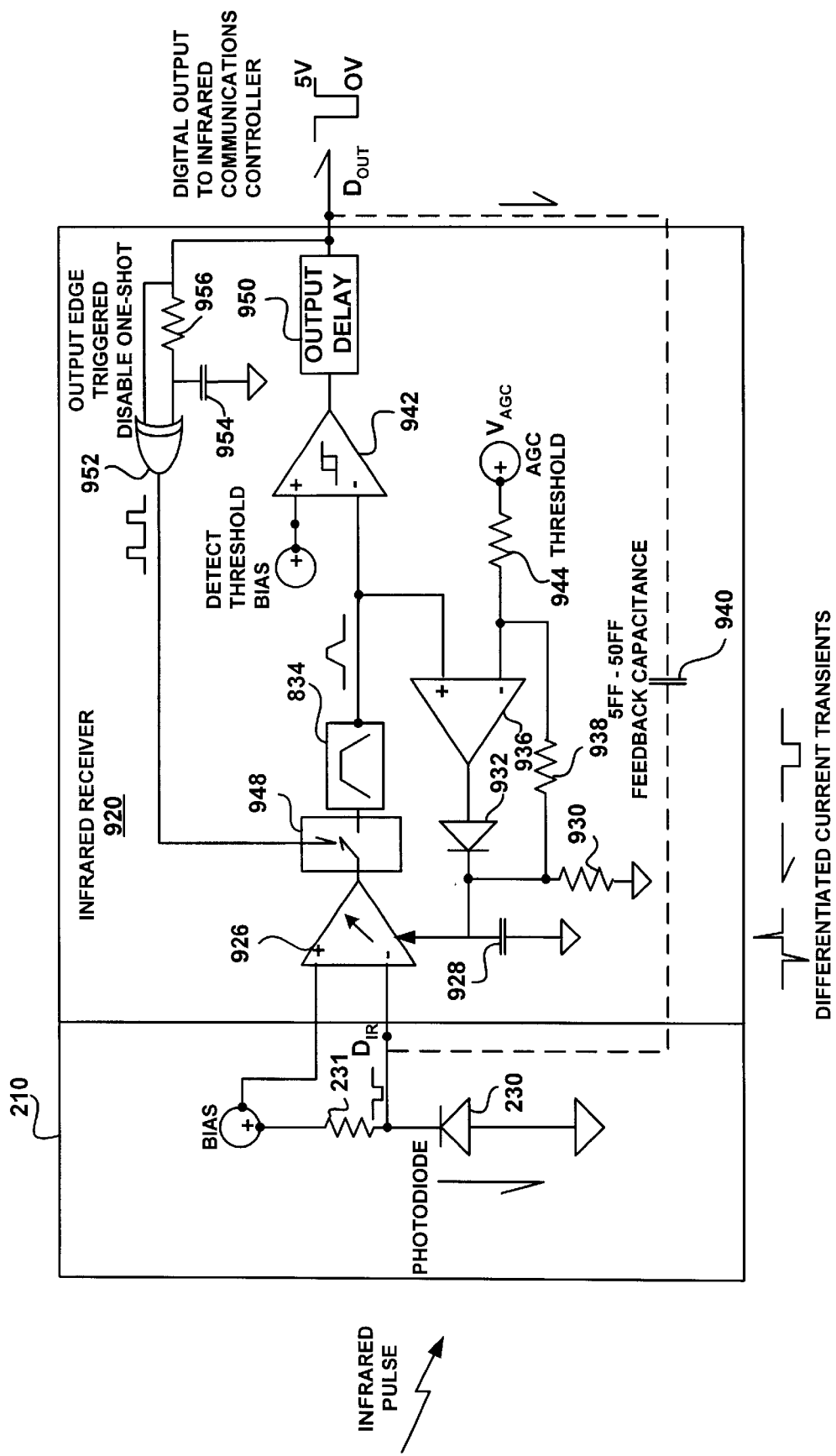
FIG. 6 is a functional block diagram of still yet another embodiment of the infrared receiver circuit of FIG. 2.

Another embodiment of a receiver circuit suitable for use as receiver 220 of FIG. 2 is receiver circuit 920 of FIG. 6. The high amplitude of the feedback pulses contributes to ringing, overshoot and undershoot at the output of bandpass filter 834 of receiver 820. Thus, receiver 920 is constructed with signal disable switch 948 interposed between the output of input amplifier 926 and bandpass filter 934. This configuration permits the disable pulses generated by XOR 952 responsive to the edges in the output signal to isolate bandpass filter 934, comparator 942 and AGC peak detector 936 from the receive signal path when feedback from $D_{OUT}$. This configuration causes the feedback transient to settle more rapidly because the transient is prevented from entering the bandpass filter 934 where the transient is prolonged due to the increase in ringing, overshoot and undershoot that would otherwise occur due to feedback transients in the output response of bandpass filter 934. This permits receiver 920 to tolerate larger amplitude feedback signals, use a narrower bandwidth to improve the signal to noise ratio of the receiver, or operate at faster pulse rates without corruption of the data output signal at $D_{OUT}$.

Because of variations in device tolerances and operating conditions, it is not possible to exactly predict when the feedback transients in the received signal path will settle. For slower communications formats, the duration of the disable pulses may be extended to account for variations in the settling time of the feedback peaks. However, faster communications formats, such as the 4 MB format described above, have narrow windows because the data is related to the temporal position of the pulse which requires rapid settling times. As a result, the disable signal generated by XOR 952 may not coincide exactly with the feedback peaks.

For example, if the disable signal is 1.5 us, then valid input signal transitions which have less than 1.5 us between them cannot be detected. To capture these signal transitions, it is necessary to set the disable signal duration to the minimum required to prevent feedback disruption. However, due to variances in IC timing circuit tolerances and variances in feedback due to variances in receiver packages and circuit board trace layout, it becomes necessary to set the signal disable period to a larger value than is typically required so as to ensure that most receivers will function without feedback disruption. This adds a difficult engineering burden of correctly determining the optimum signal disable duration and undesirable limiting maximum pulse rate on receiver packages or board layouts which have low feedback levels.

Figure 7:
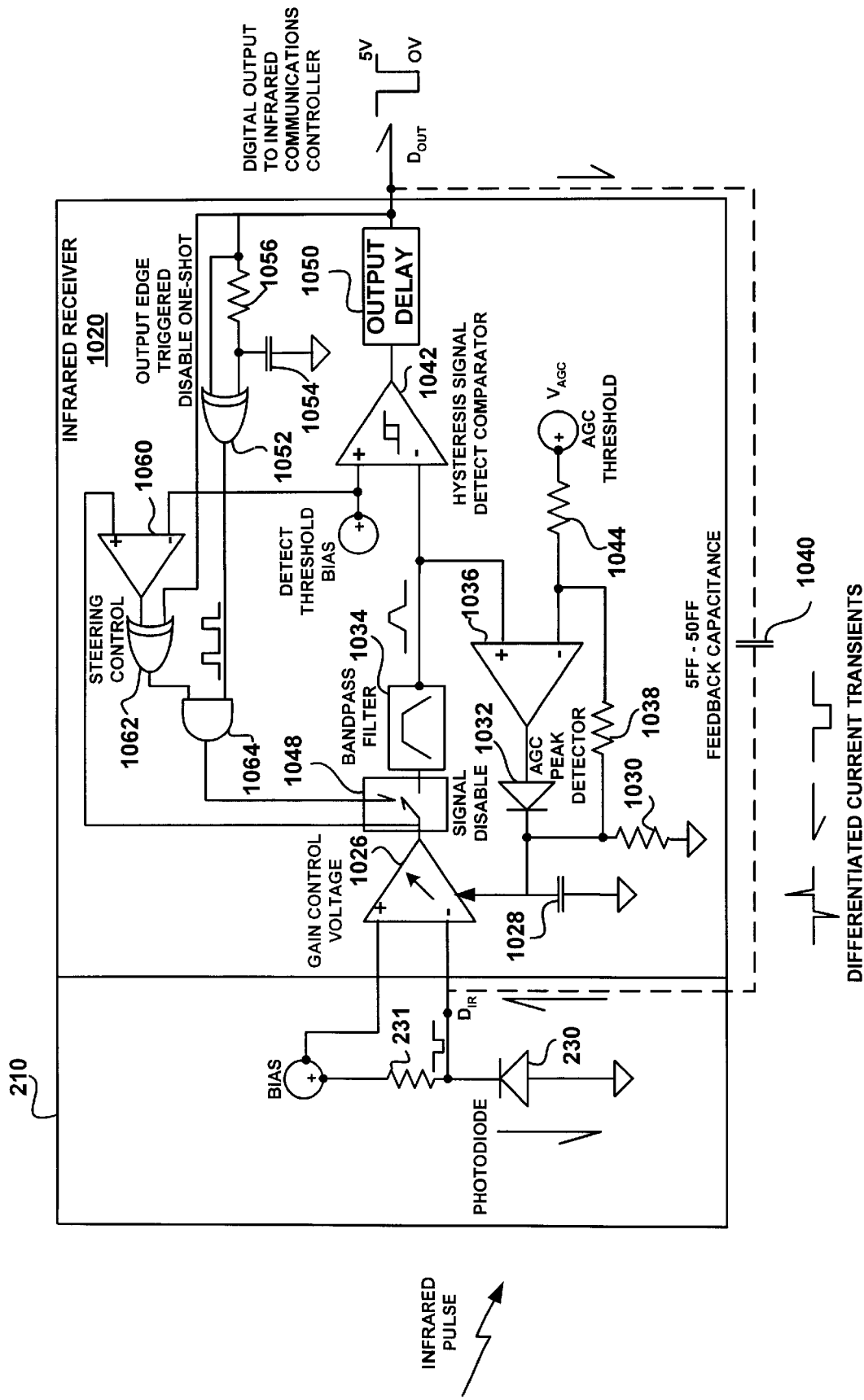
FIG. 7 is a functional block diagram of a further embodiment of the infrared receiver circuit of FIG. 2.

Yet another embodiment of a receiver circuit suitable for use as integrated receiver 220 of FIG. 2 is receiver 1020 of FIG. 7. In order to accommodate faster communications formats and address variation in signal settling, receiver 1020 is designed with positive feedback and feedback detection which monitors the feedback transients and prevents signal disable switch 1048 from closing while a feedback transient is present.

Feedback detect comparator 1060 compares the amplified input data signal at the output of input amplifier 1026 to the detection threshold voltage level $V_{DET}$ and output a high level signal so long as the amplified input signal is greater that the detection threshold. Exclusive-OR 1062 compares the output of the feedback detect comparator 1060 with the delayed digital output signal and outputs a high level signal if the two signals differ. Conversely, exclusive-OR 1062 outputs a low level if the two signals are in agreement. This low output signal will propagate through AND gate 1064 to close signal disable switch 1048 before the edge triggered disable signal output from exclusive-OR 1052 would normally cause switch 1048 to close. This permits receiver 1020 to operate at higher speeds when the transient settling time is faster than that predicted solely by the timing of the edge-triggered one shot circuit.

The photodiode of the present invention can also be incorporated into differential methods for receiving an infrared signal. In FIG. 8, a pair of photodiodes 1130 and 1140 are separately input to differential inputs $D_{IR1}$ and $D_{IR2}$, respectively, of receiver 1120. Photodiode 1130 is formed by producing N-diffusion 1132 in P-substrate 210. Similarly, photodiode 1140 is formed by producing N-diffusion 1142 in substrate 1110. But photodiode 1140 is also covered with an opaque shield or coating 1146 which prevents the infrared light signal from reaching photodiode 1140. Photodiodes 1130 and 1140 are fabricated using high precision semiconductor fabrication techniques and therefore can be produced with a high level of symmetry with respect to the receiver output terminal $D_{OUT}$ so as to have almost identical feedback capacitance to $D_{OUT}$. As a result, excellent immunity to external noise sources and receiver feedback can be obtained using the matched photodiodes 1130 and 1140.

The receiver circuits 420, 620, 820, 920 and 1020 can each be modified to operate in a differential mode with the photodiodes illustrated in FIG. 8, as would be apparent to one skilled in the art.

Having illustrated and described the principles of the present invention in the context of the embodiments described above, it should be readily apparent to those skilled in the art that the invention can be modified in arrangement and detail without departing from such principles. For example, while much of the circuitry described herein is constructed using analog circuits, such as the analog timer and comparators, it should be readily understood that similar function can be obtained using digital components.

I claim:

1. An integrated photodiode and receiver circuit on a substrate, the integrated receiver circuit comprising:
   a first diffused region in the substrate for receiving an input signal;
   a first circuit input terminal coupled to the first diffused region;
   a circuit output terminal;
   an input amplifier interposed between the first circuit input and receiver output terminals, the input amplifier being configured to receive and amplify the input signal to produce an amplified input signal, and wherein the input amplifier is further configured to vary the gain of the input amplifier responsive to a gain control signal;
   a bandpass filter interposed between the input amplifier and the circuit output terminal, the bandpass filter being configured to receive and bandpass filter the amplified input signal so as to produce a filtered input signal;
   a comparator interposed between the bandpass filter and the circuit output terminal, the comparator being configured to compare the filtered input signal to a detection threshold voltage level in order to generate a digital output signal;
   a delay circuit interposed between the comparator and the circuit output terminal, the delay circuit being configured to receive the digital output signal and generate a delayed digital output signal responsive thereto;
   an automatic gain control circuit configured to receive the filtered input signal, the automatic gain control circuit comparing the filtered input signal to an automatic gain control threshold voltage and generating the gain control signal responsive thereto;
   an isolation control signal generator configured to receive the delayed digital output signal and generating an isolation control signal responsive thereto; and
   an isolation switch interposed between the input amplifier and the automatic gain control circuit, the isolation switch being configured to receive the isolation control signal and, responsive thereto, isolate the automatic gain control circuit from the amplified input signal.

2. The integrated receiver circuit of claim 1 wherein the isolation switch is further configured to isolate the comparator from the amplified input signal responsive to the isolation control signal.

3. The integrated receiver circuit of claim 1 wherein the isolation switch is further configured to isolate the bandpass filter from the amplified input signal responsive to the isolation control signal.

4. The integrated receiver of claim 1 wherein the isolation control signal generator comprises a one-shot circuit configured to generate an output pulse of a predetermined duration responsive to a falling edge in the delayed digital output signal.

5. The integrated receiver of claim 1 wherein the isolation control signal generator comprises an edge triggered one-shot circuit configured to generate an output pulse of a predetermined duration responsive to each edge in the delayed digital output signal.

6. The integrated receiver of claim 5 wherein the edge triggered one-shot circuit comprises:
   a first exclusive-OR gate having first and second input terminals and an output terminal, wherein the first input terminal is configured to receive the delayed digital output signal;
   a resistor having first and second terminals, wherein the first terminal is configured to receive the delayed digital output signal, and further wherein the second terminal is coupled to the second input terminal of the first exclusive-OR gate; and
   a capacitor coupled between the second input terminal of the first exclusive-OR gate and ground;
   whereby the first exclusive-OR gate generates the isolation control signal at its output terminal responsive to the delayed digital output signal.

7. The integrated receiver of claim 5 wherein the isolation control signal generator further includes:
   a feedback detect comparator configured to receive the amplified input signal and compare it to the detection threshold voltage level to produce a feedback detect signal;
   a second exclusive-OR gate having first and second input terminals and an output terminal, wherein the first input terminal is configured to receive the feedback detect signal and the second input terminal is configured to receive the delayed digital output signal; and
   an AND gate having first and second input terminals and an output terminal, wherein the first input terminal is coupled to the output terminal of the first exclusive-OR gate and the second input terminal is coupled to the output terminal of the second exclusive-OR gate whereby the AND gate generates the isolation control signal at its output terminal.

8. An infrared receiver circuit formed on a substrate, the circuit comprising:

a first diffusion in the substrate;

an input amplifier having first and second input terminals, a gain control terminal and an output terminal, the first input terminal being configured to receive a first bias voltage and the second input terminal being coupled to the first diffusion;

a bandpass filter having input and output terminals, the input terminal being coupled to the output terminal of the input amplifier;

a comparator having first and second input terminals and an output terminal, the first input terminal being configured to receive a detection threshold voltage, the second input terminal being coupled to the output of the bandpass filter, and the output terminal being coupled to an output terminal of the receiver circuit;

an automatic gain control circuit having first and second input terminals and an output terminal, the first input terminal being coupled to the output of the bandpass filter, the second input terminal being configured to receive an automatic gain control threshold voltage, and the output terminal being coupled to the gain control terminal of the input amplifier;

a delay circuit having input and output terminals, wherein the input terminal is coupled to the output terminal of the comparator such that a delayed digital output signal is generated at the output terminal of the delay circuit responsive to an input data signal received at the input terminal of the delay circuit;

an isolation control signal generator having input and output terminals, wherein the input terminal is coupled to the output terminal of the delay circuit, and wherein the isolation control signal generator is configured to generate a pulse of predetermined duration at its output terminal responsive to an edge in the delayed digital output signal; and an isolation switch having input, output and control terminals, the control terminal being coupled to the output terminal of the isolation control signal generator such that the isolation switch isolates the input terminal thereof from the output terminal thereof responsive to the automatic gain control signal, the input terminal of the isolation switch being coupled to the output terminal of the input amplifier, the output terminal of the isolation switch being coupled to the first input terminal of the automatic gain control circuit such that the isolation switch is interposed between the first input terminal of the automatic gain control circuit and the output terminal of the input amplifier whereby the isolation switch isolates the automatic gain control circuit from the output terminal of the input amplifier responsive to the isolation control signal.

9. The receiver of claim 8 wherein the output terminal of the isolation switch is further coupled to the second input terminal of the comparator such that the isolation switch is interposed between the second input terminal of the comparator and the output terminal of the input amplifier whereby the isolation switch isolates the comparator from the output terminal of the input amplifier responsive to the isolation control signal.

10. The receiver of claim 8 wherein the output terminal of the isolation switch is further coupled to the input terminal of the bandpass filter such that the isolation switch is interposed between the input terminal of the bandpass filter and the output terminal of the input amplifier whereby the isolation switch isolates the bandpass filter from the output terminal of the input amplifier responsive to the isolation control signal.

11. The receiver of claim 9 wherein the output terminal of the isolation switch is further coupled to the input terminal of the bandpass filter such that the isolation switch is interposed between the input terminal of the bandpass filter and the output terminal of the input amplifier whereby the isolation switch isolates the bandpass filter from the output terminal of the input amplifier responsive to the isolation control signal.

12. The receiver of claim 11 wherein the isolation control signal generator comprises a one-shot circuit configured to generate an output pulse of a predetermined duration at the output terminal responsive to a falling edge in the delayed digital output signal.

13. The receiver of claim 11 wherein the isolation control signal generator comprises an edge triggered one-shot circuit configured to generate an output pulse of a predetermined duration at the output terminal responsive to each edge in the delayed digital output signal.

14. The receiver of claim 13 wherein the edge triggered one-shot circuit comprises:

a first exclusive-OR gate having first and second input terminals and an output terminal, the first input terminal being coupled to the output terminal of the delay circuit and the output terminal being coupled to the control terminal of the isolation switch;

a resistor having first and second terminals, the first terminal being coupled to the output terminal of the delay circuit, and the second terminal being coupled to the second input terminal of the first exclusive-OR gate; and a capacitor coupled between the second input terminal of the first exclusive-OR gate and ground;

whereby the first exclusive-OR gate generates the isolation control signal at its output terminal responsive to the delayed digital output signal.

15. The receiver of claim 14 wherein the isolation control signal generator further includes:

a feedback detect comparator having first and second input terminals and an output terminal, the first input terminal being coupled to the output terminal of the input amplifier, and the second input terminal being configured to receive the detection threshold voltage;

a second exclusive-OR gate having first and second input terminals and an output terminal, the first input terminal being coupled to the output terminal of the feedback detect comparator, and the second input terminal being coupled to the output terminal of the delay circuit; and an AND gate having first and second input terminals and an output terminal, the first input terminal being coupled to the output terminal of the first exclusive-OR gate, the second input terminal being coupled to the output terminal of the second exclusive-OR gate, and the output terminal being coupled to the control terminal of the isolation switch.

16. The infrared receiver circuit of claim 8, the circuit further comprising:

a second diffusion in the substrate;

an opaque shield formed over the second diffusion and spaced apart from the first diffusion; and wherein the second diffusion is coupled to the first input terminal of the input amplifier.

17. A method for suppressing feedback in a photodiode and a receiver fabricated on a substrate, the method comprising the steps:

receiving an input signal with the photodiode;

amplifying the input signal to produce an amplified input signal;

controlling the gain of the input signal amplification responsive to the magnitude of the amplified input signal;

comparing the amplified input signal to a detection threshold voltage to produce a digital output signal; and holding the gain at a substantially constant level in response to a fast signal transition in the digital output signal.

18. The method of claim 17 including the step of filtering the amplified input signal to produce a filtered input signal.

19. The method of claim 17 wherein:

the step of controlling the gain of the input signal amplification responsive to the magnitude of the amplified input signal includes the step of controlling the gain using an automatic gain control circuit; and the step of holding the gain at a substantially constant level includes the steps:

generating an isolation signal responsive to the digital output signal, and isolating the automatic gain control circuit from the amplified input signal responsive to the isolation signal.

20. The method of claim 19 wherein the step of comparing the amplified input signal to a detection threshold voltage includes using a comparator circuit to compare the amplified input signal to the detection threshold voltage and further including the step of isolating the comparator from the amplified input signal responsive to the isolation signal.

21. The method of claim 19 including:

filtering the amplified input signal using a bandpass filter to produce a filtered input signal; and isolating the bandpass filter from the amplified input data signal responsive to the isolation signal.

22. The method of claim 19 wherein the step of generating an isolation signal includes generating a pulse of a predetermined duration responsive to each falling edge in the digital output signal.

23. The method of claim 19 wherein the step of generating an isolation signal includes generating a pulse of a predetermined duration responsive to each edge in the digital output signal.

24. The method of claim 17 wherein the step of comparing the filtered input signal to a detection threshold voltage to produce a digital output signal includes the step of introducing a time delay to the digital output signal.

* * * * *